(12) United States Patent
Lassmann et al.

(10) Patent No.: US 10,728,999 B2
(45) Date of Patent: Jul. 28, 2020

(54) CIRCUIT BOARDS AND METHOD TO MANUFACTURE CIRCUIT BOARDS

(71) Applicant: ZF Friedrichshafen AG, Friedrichshafen (DE)

(72) Inventors: Wilfried Lassmann, Hirschau (DE); Jörg Kühnl, Weiherhammer (DE)

(73) Assignee: ZF FRIEDRICHSHAFEN AG, Friedrichshafen (DE)

( * ) Notice: Subject to any disclaimer, the term of this patent is extended or adjusted under 35 U.S.C. 154(b) by 0 days.

(21) Appl. No.: 16/206,420

(22) Filed: Nov. 30, 2018

(65) Prior Publication Data

US 2019/0174619 A1   Jun. 6, 2019

(30) Foreign Application Priority Data

Dec. 5, 2017 (DE) .................. 10 2017 221 861

(51) Int. Cl.
    H05K 1/02      (2006.01)
    H05K 7/20      (2006.01)
    H05K 3/22      (2006.01)
    H05K 3/46      (2006.01)
    H05K 1/18      (2006.01)

(52) U.S. Cl.
    CPC .......... *H05K 1/0204* (2013.01); *H05K 1/021* (2013.01); *H05K 1/0206* (2013.01); *H05K 1/0209* (2013.01); *H05K 1/0263* (2013.01); *H05K 1/0265* (2013.01); *H05K 3/222* (2013.01); *H05K 3/46* (2013.01); *H05K 7/20909* (2013.01); *H05K 1/0298* (2013.01); *H05K 1/181* (2013.01); *H05K 2201/10272* (2013.01); *H05K 2201/10363* (2013.01)

(58) Field of Classification Search
    CPC ........ H05K 7/209–20918; H05K 2201/10272; H05K 1/0263; H05K 3/222; H05K 2201/10363
    See application file for complete search history.

(56) References Cited

U.S. PATENT DOCUMENTS

| 5,875,091 A * | 2/1999 | Rieken | H01R 13/6625 361/328 |
| 7,548,411 B2 * | 6/2009 | Yamamura | H05K 1/0263 361/611 |
| 7,911,769 B2 * | 3/2011 | Yamamura | H05K 1/0263 361/611 |
| 8,018,047 B2 * | 9/2011 | Bayerer | H01L 23/3735 257/700 |
| 9,545,007 B2 * | 1/2017 | Berglund | H05K 1/0263 |
| 9,867,274 B2 * | 1/2018 | Taguchi | H05K 1/0203 |

FOREIGN PATENT DOCUMENTS

EP          3089565 A1    3/2016

* cited by examiner

Primary Examiner — Robert J Hoffberg
(74) Attorney, Agent, or Firm — Brinks Gilson & Lione

(57) ABSTRACT

A printed circuit board (1) comprises a conductive outer layer (2) and at least one conductive inner layer (4, 14). At least one bus bar (7, 8) for conducting high current and at least one power semiconductor (12) for controlling and/or activating the high current are disposed on a side of the outer layer (2) facing away from the at least one inner layer (4, 14). The printed circuit board (1) allows for a high level of component density while simultaneously providing for effective heat dissipation. Furthermore, the printed circuit board (1) can be produced economically and flexibly.

11 Claims, 5 Drawing Sheets

CIRCUIT BOARDS AND METHOD TO MANUFACTURE CIRCUIT BOARDS

CROSS-REFERENCE TO RELATED APPLICATIONS

Figure 1:
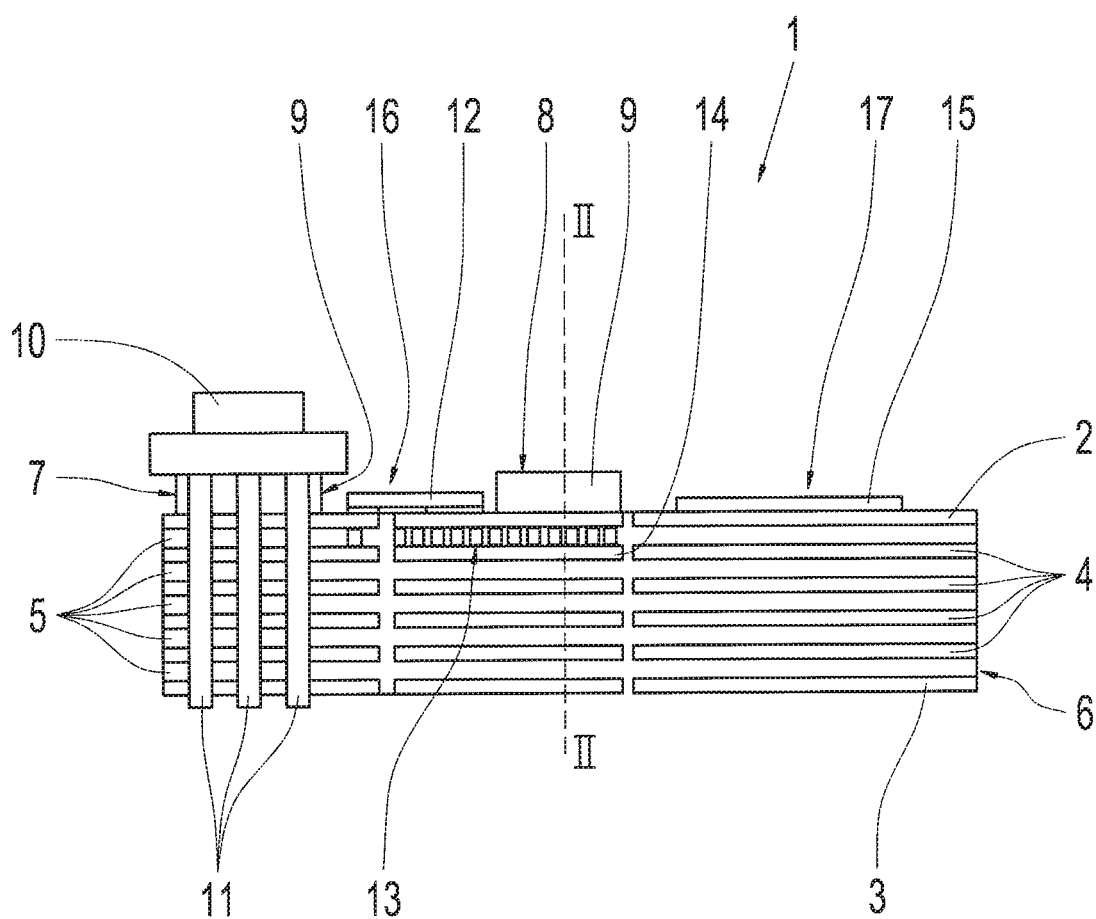

This application claims priority from German Patent Application DE 20 2017 221 861.4, filed Dec. 5, 2017, the entirety of which is hereby fully incorporated by reference herein.

The invention relates to a printed circuit board, in particular a multifunctional high current printed circuit board. The invention also relates to a method for the production of a printed circuit board.

Printed circuit boards are known from the prior art. An exemplary printed circuit board is described in EP 3 089 565 A1.

The object of the present invention is to create an improved printed circuit board that enables in particular high component density with a more effective heat dissipation, and which can be manufactured economically.

This object is achieved by a printed circuit board that has the features disclosed herein. The printed circuit board comprises a conductive outer layer and at least one conductive inner layer. The conductive outer layer and at least one conductive inner layer shall be referred to below as an outer layer and at least one inner layer for purposes of simplicity. The printed circuit board also has at least one bus bar for conducting high current and at least one power semiconductor for controlling and/or activating the high current. The at least one bus bar and the at least one power semiconductor are disposed on a side of the outer layer facing away from the at least one inner layer.

The at least one bus bar and the at least one power semiconductor form a power region. The at least one inner layer and regions of the conductive outer layer that are not occupied by the at least one bus bar and the at least one power semiconductor, thus not assigned to the power region, can be used for a control and regulating region for activating the at least one power semiconductor. As a result, a high level of integration of various regions and the components thereof, in particular the power, and control or regulating, components, is possible in and on the printed circuit board.

The power region is also referred to as a high current region. A high current is conducted to the power region, in particular a high current of at least 200 amperes. Thick copper layers are not needed for conducting the high current. Furthermore, the control and regulating region and in particular the at least one inner layer and the outer layer can be manufactured using standard technologies. This ensures an economic manufacturing thereof. Furthermore, the printed circuit board can be adapted to the respective application, in particular the necessary power classification. For this, starting from multilayer systems manufactured using standard technologies, which comprise the at least one outer layer and the at least one inner layer, the printed circuit board according to the invention can be flexibly adapted to the respective need. The power classification in particular can thus be determined by the diameter, the material, and the geometry of the bus bars that are used.

The at least one power semiconductor is a power switch in particular, in particular a power transistor, e.g. a MOSFET or IGBT. Alternatively, the at least one power switch can also be a power diode, e.g. a power LED. If there are numerous power semiconductors, the different power semiconductors can be of different types.

The printed circuit board preferably has numerous conductive inner layers. Insulating layers, in particular insulating layers made of an FR-4 composite, with or without fiberglass reinforcement, can be disposed between various inner layers and/or between the outer layer and an adjacent inner layer. A side of the printed circuit board facing away from the conductive outer layer can have a second conductive outer layer. In this case, bus bars and/or power semiconductors can also be disposed on the second conductive outer layer. It is preferred, however, that all of the bus bars and all of the power semiconductors are disposed on the same conductive outer layer.

The at least one bus bar and the at least one power semiconductor are disposed on the outer surface of the outer layer. Preferably, all of the power semiconductors and bus bars, and particularly preferably the entire power region, are disposed on the outer surface of the conductive outer layer. The power components disposed on the outer surface have an exposed surface. The exposed surface forms a cooling surface, in particular an exposed cooling surface, which ensures an effective heat dissipation from the power region. The power region is advantageously not in an inner layer of the printed circuit board, as is the case with conventional thick copper layers, by way of example, and it is not embedded in particular between insulating layers with limited thermal conductivity. As a result, expensive and intricate methods for heat splaying and/or heat dissipation, e.g. via thermal vias, copper inserts or insulated metal substrates, are not necessary. The effective heat dissipation increases the service life of the printed circuit board and allows for an increased component density.

According to one aspect of the invention, the at least one bus bar and/or the at least one power semiconductor are thermally connected to a cooling element. Preferably, the entire power region is thermally connected to the cooling element. The thermal connection can be established in particular through direct contact with the cooling element. By way of example, the cooling element can be disposed on a side of the at least one bus bar and/or the at least one power semiconductor facing away from the conductive outer layer. Alternatively, the cooling element can also be disposed in the level of the conductive outer layer adjacent to the power region. In a preferred embodiment, the at least one bus bar and/or the at least one power semiconductor can be integrated in the cooling element, by means of which a particularly effective and direct thermal connection to the cooling element is ensured. The cooling element can be passive, e.g. in the form of a cooling paste, cooling medium, or cooling fins.

The cooling element allows the printed circuit board to be operated in a demanding thermal environment, in particular at temperatures higher than 150° C. The cooling element can also be used for cooling the control and regulating region. Particularly preferably, the power region is cooled directly, and the control and regulating region is cooled indirectly.

According to one aspect of the invention, the cooling element is suitable for active cooling of the at least one bus bar and/or the at least one power semiconductor. In particular, the cooling element is suitable for active cooling of the entire power region. Preferably, a cooling of the control and regulating region, in particular an indirect cooling thereof, also takes place via the active cooling. The active cooling can be adapted to the respective application, in particular to the power classification of the printed circuit board. The active cooling can also be adapted to the respective operating state of the printed circuit board. The active cooling can take place in particular via water and air cooling, e.g. with a fan.

According to a further aspect of the invention, at least one control electronics component is disposed in a region of the side of the outer layer facing away from the at least one inner layer, in which neither the at least one bus bar, nor the at least one power semiconductor are disposed. The at least one control electronics component is therefore disposed outside the power region on the conductive outer layer, and can be a part of the control and regulating region. This enables a high level of integration of various functional regions on the printed circuit hoard. The control and regulating region is not limited to the at least one inner layer of the printed circuit board. The at least one control electronics component can be a surface mounted device (WI)). In particular, the at least one control electronics component can have fine etched structures.

According to one aspect of the invention, the at least one inner layer of the printed circuit board is a thin ply layer. Thin ply layers are thin, in particular with a thickness of less than 105 μm. With numerous inner layers, individual layers can also be thick copper layers with a layer thickness of 210 μm or more, as needed. Preferably, however, all of the inner layers of the printed circuit board are thin ply layers. In contrast to printed circuit boards with thick copper layers, printed circuit boards that only have thin ply layers can be economically manufactured using standard technologies.

According to one aspect of the invention, the at least one bus bar is made of copper or aluminum. These materials have proven to be particularly suitable for this. Because of the conductivity of copper and aluminum, small bus bar geometries, in particular small bus bar diameters, can be used, such that the integration density can be increased. The at least one bus bar is particularly preferably made of copper. Copper is inexpensive, thus reducing the production costs for the printed circuit board.

According to one aspect of the invention, the at least one bus bar has at least one contact section. The contact section of the bus bar is connected in a conductive manner to the outer layer. A direct input and output of high current in the outer layer is possible via the contact section. Preferably, the at least one bus bar has numerous contact sections. The at least one contact section can be connected to the outer layer using through-hole technology (THT) or a screw connection.

According to a further aspect of the invention, the at least one contact section is soldered to the outer layer. Wave soldering, cavity-free or low-cavity soldering are ideal for this. The soldered connection is preferably generated via reflow soldering. This is a very efficient means, because the at least one bus bar can then be attached to the outer layer at the same time as other components, in particular control electronics components.

Regions of the outer layer that are not soldered to a contact section of a bus bar or other components can be entirely or partially coated with a solder resist coating.

According to a further aspect of the invention, the at least one contact section is connected to the outer layer by means of an insert element. A particularly high total current can be conducted via insert elements to or from the other layers of the printed circuit board, in particular the outer layer.

Some of the connecting technologies specified above can also be combined. As such, the at least one contact section can be connected to the outer layer by means of an insert element, and at the same time soldered thereto. Different contact sections can be connected to the outer layer via different connecting technologies. The type of connection is preferably adapted to the respective application, e.g. to the overall current that is to be conducted to or from the printed circuit board.

According to a further aspect of the invention, the conductive outer layer is connected to one of the at least one inner layers, which is directly adjacent to the outer layer, in the region of the at least one bus bar and/or the at least one power semiconductor, by means of vias, in particular laser vias. An inner layer is directly adjacent to the outer layer when there are no further conductive inner layers, but at most an insulating layer, between this inner layer and the outer layer. This inner layer, which is directly adjacent to the outer layer, is also referred to below as the first inner layer. The vias connect the outer layer to the first inner layer, in particular in the region of the at least one contact section of the at least one bus bar. A direct thermal and galvanic connection of the outer layer to the first inner layer is obtained by means of the vias. As a result, a compact thermal capacitance is obtained, by means of which high and fast temperature ripples in particular can be effectively absorbed. In particular, a thermal barrier is not needed between the first inner layer and the outer layer. Furthermore, a conductive connection can be formed between the at least one bus bar and/or the at least one power semiconductor via the outer layer and the first inner layer. The vias particularly preferably exhibit a high placement density, by means of which the thermal and galvanic connection is optimized.

According to a further aspect of the invention, the at least one bus bar has at least one non-contact section, where the bus bar is spaced apart from the outer layer. In particular, the bus bar is spaced apart from the outer layer in the at least one non-contact section along the surface norm of the outer layer. Each bus bar preferably has numerous non-contact sections. The at least one bus bar preferably has alternating contact sections and non-contact sections. Additional components and their current conductors can be mounted in an intermediate space formed between the at least one non-contact section of the at least one bus bar and the outer layer. This ensures a particularly high integration density of components on the printed circuit board.

According to another aspect of the invention, an EMC component is disposed between the at least one non-contact section of the at least one bus bar and the outer layer. This increases the electromagnetic compatibility of the printed circuit board with other devices. Furthermore, the electromagnetic compatibility of various components on the printed circuit board is also ensured, in particular between the at least one bus bar and other control electronics components. Capacitors or inductors can be used by way of example as suitable EMC components. There is preferably an EMC component between each non-contact section and the conductive outer layer. As a result, the EMC components can act directly where high currents are activated. This ensures an effective electromagnetic shielding.

According to a further aspect of the invention, the printed circuit board has numerous bus bars and numerous power semiconductors. Complex topologies can be formed by placing numerous bus bars and power semiconductors on the outer layer. The printed circuit board, and in particular its power classification, can be varied by the placement of the bus bars and the power semiconductors, and adapted to the respective application. This provides for an economical and flexible production of the printed circuit board.

According to a further aspect of the invention, at least two bus bars are connected by numerous power semiconductors connected in parallel.

The power semiconductors are power switches in particular. A connection of the bus bars in this manner enables a division of a large total current into numerous partial currents. By activating and deactivating partial currents, the amperage of the total current can be adjusted.

Another object of the invention is to create an improved, in particular more economical and flexible, method for manufacturing a printed circuit board.

This object is achieved by a method that has the steps disclosed herein. First, a multilayer system with a conductive outer layer and at least one conductive inner layer is provided. The outer layer and the at least one inner layer can have the properties described above. The multilayer system can be manufactured in particular using standard technologies. The multilayer system is economical. At least one bus bar and at least one power semiconductor are disposed on a side of the outer layer facing away from the at least one inner layer to produce the printed circuit board. The printed circuit board, and in particular its power classification, can be adapted to the respective application through the selection of the properties of the at least one bus bar and the at least one power semiconductor. In particular, various topologies can be created with bus bars and power semiconductors. The production can thus be flexibly adapted to the manufacturing of different printed circuit boards.

The at least one bus bar can have at least one contact section and at least one non-contact section, as described above. The at least one bus bar is connected in a conductive manner to the outer layer at the at least one contact section. The at least one bus bar is spaced apart from the outer layer at the at least one non-contact section.

In a preferred embodiment of the method, vias, in particular laser vias, are placed in a region provided for the placement of the at least one power semiconductor and/or the at least one bus bar, prior to placing the at least one bus bar and the at least one power semiconductor therein. The outer layer is galvanically and thermally connected to one of the at least one inner layers that is directly adjacent to the outer layer by the vias. The vias are placed in particular in a region of the outer layer in which at least one contact section of the at least one bus bar is connected in a conductive manner to the outer layer.

In another preferred embodiment of the invention, the at least one contact section of the bus bar and/or the power semiconductor are soldered to the outer layer, in particular via a reflow soldering process. This has the advantage that the at least one bus bar and/or the at least one power semiconductor can be placed on the surface at the same time as the other SMD components. The method is economical.

In another embodiment of the method, the at least one contact section of the at least one bus bar is connected to the outer layer via an insert element.

Furthermore, EMC components can be placed in an intermediate space formed between the at least one non-contact section of the at least one bus bar and the printed circuit board. Furthermore, cooling elements can also be placed adjacent to the at least one bus bar and/or the at least one power semiconductor.

Figure 2:
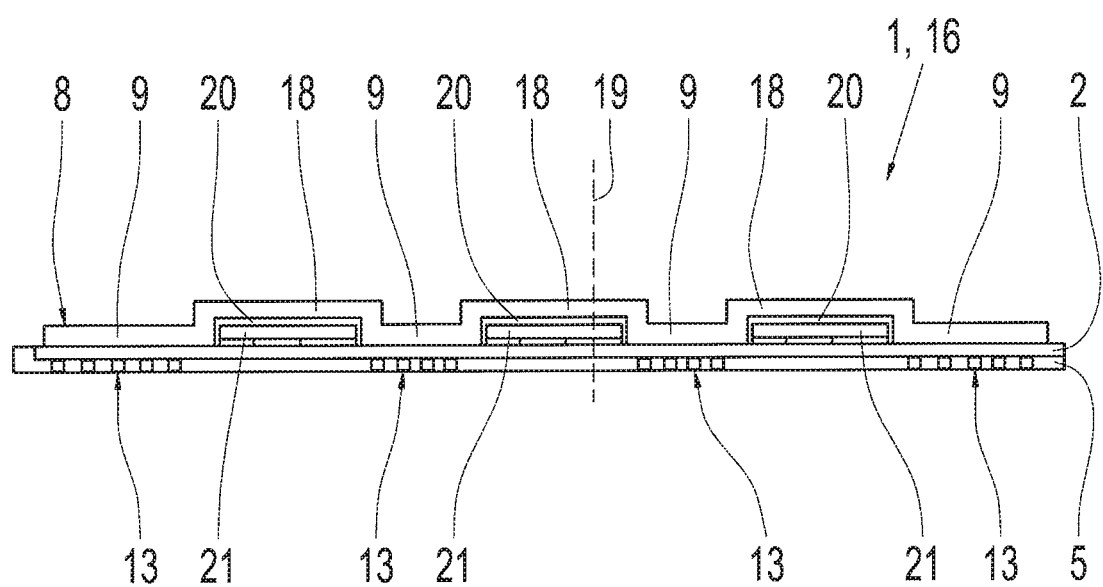
Figure 3:
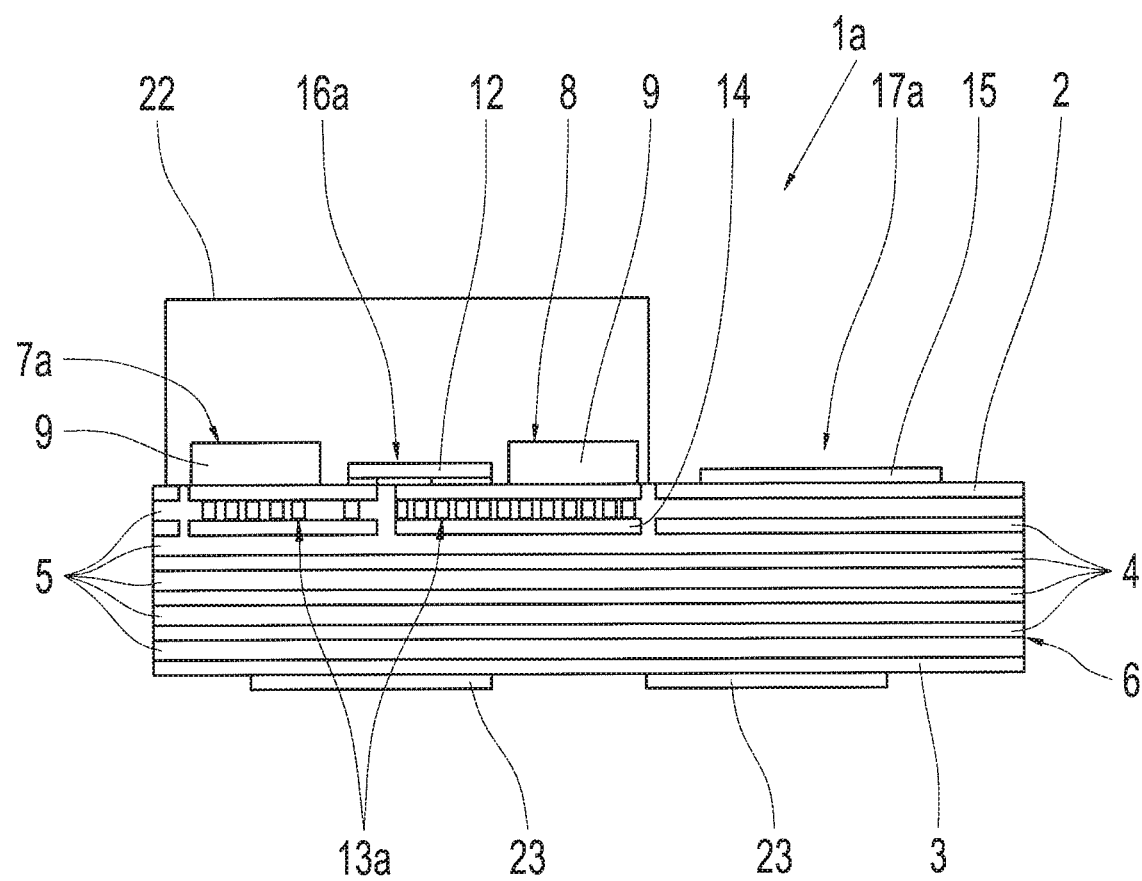
Figure 4:
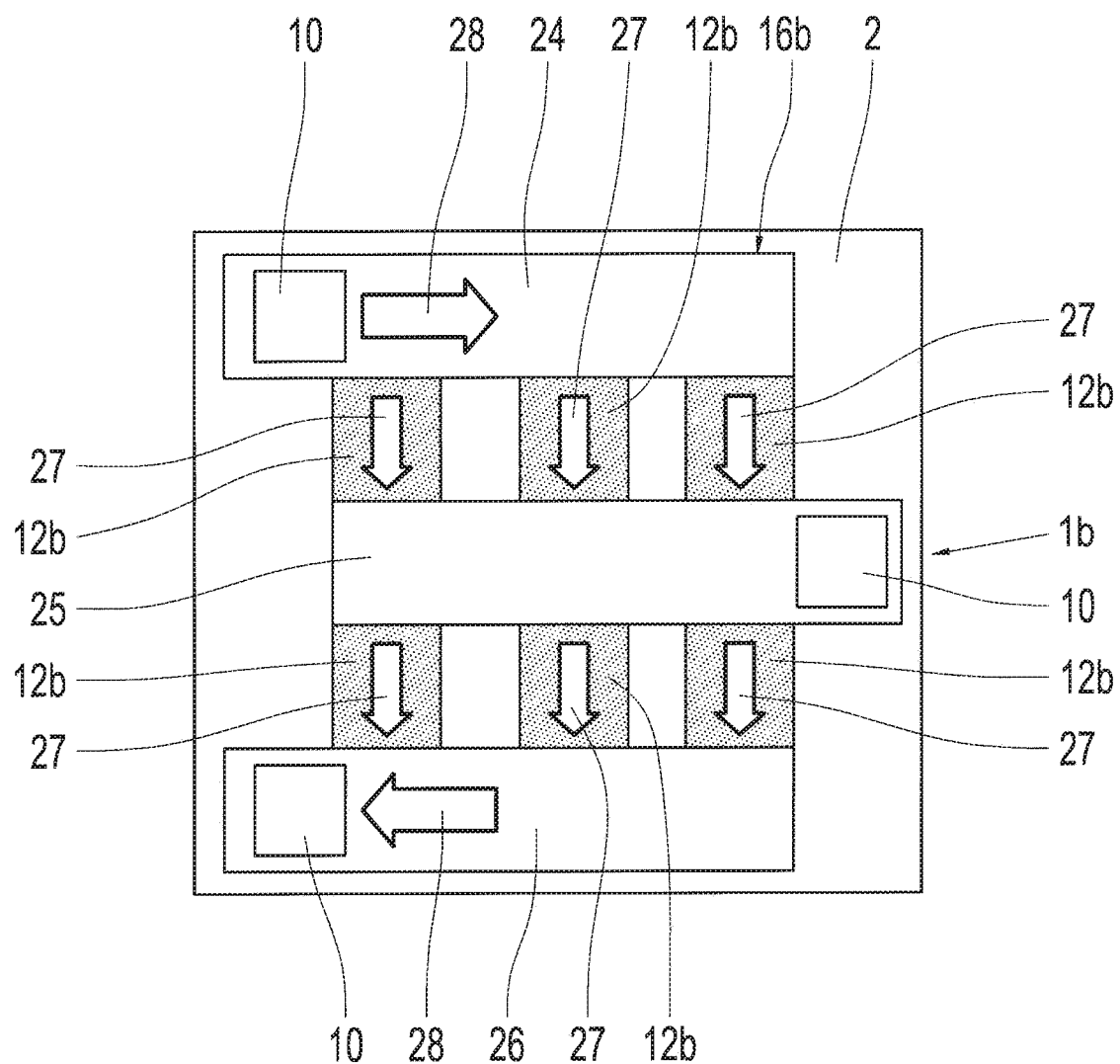
Figure 5:
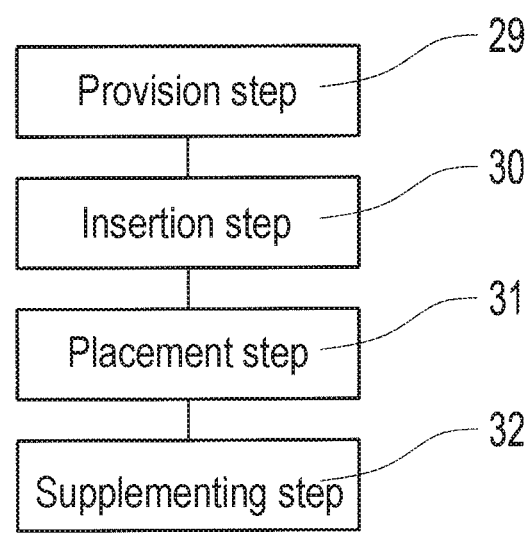

Further features, advantages and details of the invention can be derived from the exemplary embodiments described below on the basis of the drawings. Therein:

FIG. 1 shows a schematic illustration of a cross section of an exemplary embodiment of a printed circuit board according to the invention, FIG. 2 shows a schematic illustration of a longitudinal section along the sectioning line II-II of a bus bar and an outer layer of the printed circuit board according to FIG. 1, FIG. 3 shows a schematic illustration of a cross section of another exemplary embodiment of a printed circuit board, FIG. 4 shows a schematic illustration of a top view of another exemplary embodiment of a printed circuit board, and FIG. 5 shows a schematic 1 of a method for manufacturing a printed circuit board.

A first exemplary embodiment of a printed circuit board 1 is schematically illustrated in FIGS. 1 and 2. FIG. 1 shows a cross section of the printed circuit board 1. The printed circuit board 1 is a high current printed circuit board. The printed circuit board 1 comprises a conductive outer layer 2 and a second conductive outer layer 3 disposed on a side of the printed circuit board 1 lying opposite the outer layer 2. Numerous conductive inner layers 4 are disposed between the outer layer 2 and the second outer layer 3. The printed circuit board 1 has four conductive inner layers 4. The inner layers 4 are thin ply layers with a layer thickness of less than 105 µm.

Insulating layers 5 are placed between the outer layers 2, 3 and the inner layers 4. The insulating layers 5 are made of an FR-4 composite. The outer layers 2, 3, the inner layers 4, and the insulating layers 5 form a multilayered system 6. The multilayered system 6 can be manufactured using standard technologies, and can therefore be produced economically. The multilayer system 6 serves as a fundamental component of the printed circuit board 1.

Bus bars 7, 8 are disposed on the side of the outer layer 2 of the printed circuit board 1 facing away from the inner layers 4. The bus bars 7, 8 are made of copper. They have a cross section that enables high currents to be conducted in the bus bars. A high current of more than 200 amperes can be conducted in the bus bars 7, 8.

The cross section shown in FIG. 1 passes through a contact section 9 of each of the bus bars 7, 8. The bus bars 7, 8 are connected in a conductive manner to the outer layer 2 at the contact sections 9. For this, the contact section 9 of the bus bar 8 is soldered to the outer layer 2. The contact section 9 of the bus bar 7, in contrast, is connected to the multilayer system 6 using an insert element 10. A conductive connection is formed by the pins 11 of the insert element 10 between the bus bar 7 and the outer layer 2, as well as further inner layers 4. A partial current of the high current can thus be conducted to or from the multilayer system 6, in particular the outer layer 2, in the bus bars 7 and 8 at the contact sections 9.

A power semiconductor is located between the bus bar 7 and the bus bar 8. The power semiconductor 12 is soldered to the outer layer 2 and thus connected thereto in a conductive manner. The power semiconductor 12 is a MOSFET.

The outer layer 2 is connected to a first inner layer 14 by means of laser vias 13 in the region of the power semiconductor 12 and the contact sections 9 of the bus bar 8. The first inner layer 14 is that inner layer 4 that is directly adjacent to the outer layer 2, only being separated therefrom by a single insulating layer 5. The laser vias 13 exhibit a high placement density. As a result, the outer layer is galvanically and thermally effectively connected to the first inner layer 14. The first inner layer 14 and the outer layer 2 form a compact thermal capacitor. The power semiconductor 12 is conductively connected to the bus bars 7, 8 via the outer layer 2 and the first inner layer 14, and can control and/or activate high currents conducted therein.

A control electronics component 15 is disposed in a region of the outer layer 2 not occupied by the bus bars 7, 8 or the power semiconductor 12. The control electronics component 15 is an SMD with fine etched structures.

Different functional regions are thus integrated in the printed circuit board 1. The bus bars 7, 8 and the power semiconductor 12 define a power region 16. Regions of the outer layer 2 and the first inner layer 14, which are galvanically connected to the bus bars 7, 8 and the power semiconductor 12, also belong to the power region 16. The power region is therefore substantially located on an outer surface of the outer layer 2. Components and regions of the printed circuit board 1 that are not assigned to the power region 16 for a control and regulating region 17. The control and regulating region 17 activates the power semiconductor 12 in particular. The control electronics component 15 is part of the control and regulating region 17. As a result of the compact formation of the power region 16 in a region of the outer layer 2 it is possible to obtain a high level of integration of components, such as the control electronics component 15 and the power semiconductor 12, on the printed circuit board 1.

The power region 16 has an exposed surface. The exposed surface serves as a cooling surface, via which an effective heat dissipation from the power region 16 is ensured.

The bus bar 8, the power semiconductor 12, and the control electronics component 15 are soldered to the outer layer 2 by means of a reflow process. This has the advantage that all of these components can be attached in a single process step. This allows the printed circuit board 1 to be produced very economically. Regions of the outer layer 2, 3 to which no components are soldered are coated with a solder resist layer.

A longitudinal section through the printed circuit board 1 along the sectioning line II-II shown in FIG. 1 is shown in FIG. 2. Because the longitudinal section follows the course of the bus bar 8, only part of the power region 16 of the printed circuit board 1 is shown in FIG. 2. For purposes of simplicity, only the bus bar 8, the underlying outer layer 2, and an insulating layer 5, but no other layers of the multilayer system 6, are shown.

The bus bar 8 has four contact sections 9 at each of which the bus bar 8 is soldered to the outer layer 2, and is conductively connected therewith. The contact sections 9 are spaced apart from one another. There is a respective non-contact section 18 between each of the contact sections 9. The contact sections 9 and the non-contact sections 18 are arranged in an alternating pattern. The bus bar 8 is spaced apart from the outer layer 2 along a surface norm 19 thereof in the non-contact sections 18. Intermediate spaces 20 are thus formed between the non-contact sections 18 and the outer layer 2. An EMC component 21 is disposed in each intermediate space 20. The EMC components 21 form capacitors. The placement of the EMC components 21 in the intermediate spaces 20 is particularly space-saving and allows for a high level of integration of components on the printed circuit board 1. Furthermore, the EMC components 21 enable an effective shielding of electromagnetic fields generated by the high current in the bus bar 8. The printed circuit board 1 has a high level of electromagnetic compatibility.

The bus bar 7 has an equivalent alternating configuration of contact sections 9 and non-contact sections 18. EMC components are also disposed between the non-contact sections 18 of the bus bar 7 and the outer layer 2. As a result, the bus bar 7 is also effectively electromagnetically shielded from other layers of the printed circuit board.

A cross section of another exemplary embodiment of a printed circuit board 1a is shown schematically in FIG. 3. Components already explained in conjunction with the printed circuit board according to FIGS. 1 and 2 have the same reference symbols. Parts that differs structurally, but have the same function receive the same reference symbols with an "a" appended thereto.

The printed circuit board 1a differs from the printed circuit board 1 firstly in terms of the bus bar 7a. The contact sections 9 of the bus bar 7a are soldered to the outer layer 2. The laser vias 13a are also inserted in the regions of the contact sections 9 of the bus bar 7a between the outer layer 2 and the first inner layer 14.

Furthermore, a cooling element 22, depicted merely schematically, is located adjacent to the power region 16a. The cooling element 22 is thus thermally connected to the entire power region 16a. The cooling element 22 thus allows for a direct cooling of the power region 16a. Moreover, an indirect cooling of the control and regulating region 17a is ensured by the cooling element 22.

The cooling element 22 is a fan, and actively cools the power region 16a. Because of the cooling element 22, the printed circuit board 1a can be operated in a demanding temperature environment.

In addition to the control electronics component 15, SMDs are disposed on the second outer layer 3. The printed circuit board 1a thus exhibits a further increased integration density of electronic components in comparison with the printed circuit board 1. The SMDs 23 are part of the control and regulating region 17a.

A schematic illustration of another exemplary embodiment of a printed circuit board is shown in FIG. 4. Components already explained in conjunction with the printed circuit board according to FIGS. 1 and 2 have the same reference symbols. Parts that differs structurally, but have the same function receive the same reference symbols with an "b" appended thereto.

The printed circuit board 1b comprises three bus bars 24, 25, 26 disposed on the outer layer 2. Each of the bus bars 24, 25, 26 have an insert element 10, via which the high current can be conducted to and from the bus bars. The bus bar 24 is connected to the bus bar 25 via three power semiconductors 12b connected in parallel. The bus bar 25 is likewise connected to the bus bar 26 via three power semiconductors 12b connected in parallel. The power semiconductors 12b are power switches for activating the high current. A topology is formed on the outer layer 2 through the arrangement of the bus bars 24, 25, 26 and the power semiconductors 12b connecting them.

The bus bar 24 is connected to a DC+ potential, while the bus bar 26 is connected to a DC− potential. A partial current 27, depicted in FIG. 4 as an arrow, can be activated by each the power semiconductors 12b between the bus bars 24 and 25 and 25 and 26, respectively. Depending on how the power semiconductors 12b are switched, the partial currents 12 are combined to form a total current 28 in the bus bars 24, 26. The high current flowing through the bus bar 25 is also controlled by the respective switching of the power semiconductors 12b. A high current with AC characteristics can be generated in the bus bar 25 by an appropriate switching of the power semiconductors 12b.

The topology shown herein is not to be understood as limiting. Arbitrary topologies can also be generated by suitable combinations of bus bars and power semiconductors in other exemplary embodiments, not shown herein.

In further exemplary embodiments, not shown herein, at least some of the contact sections of the bus bars are connected in a conductive manner to the outer layer using through-hole technology or via a screw connection. In yet other exemplary embodiments, not shown herein, the contact sections are connected to the outer layer through wave soldering, cavity-free or low-cavity soldering. In other exemplary embodiments, an active cooling element for water generated cooling is located adjacent to the power region. In yet other exemplary embodiments, a passive cooling element is provided in the form of cooling tins.

A schematic flow chart for the production of a printed circuit board is shown in FIG. 5. The printed circuit boards in the exemplary embodiments described above can be produced with the method shown in FIG. 5.

First, a multilayer system is provided in a provision step 29. The multilayer system comprises a conductive outer layer and at least one conductive inner layer. The at least one conductive inner layer of the multilayer system is a thin ply layer. The multilayer system is produced using standard technologies.

Following this, laser vias are placed with high placement density between the outer layer and one of the at least one inner layers, which is directly adjacent to the outer layer, in an insertion step 30. The laser vias are placed in a region in which power semiconductors and contact sections of bus bars are later attached to the outer layer. The laser vias thermally and galvanically connect the outer layer to the adjacent inner layer.

Subsequently, at least one bus bar and at least one power semiconductor are placed on a side of the outer layer facing away from the at least one inner layer in a placement step 31. The at least one bus bar is conductively connected to the outer layer at at least one contact region thereby. The at least one contact region of the at least one bus bar is conductively connected at the region of the outer layer in which the laser vias were inserted in the insertion step 30.

The connection of the at least one contact section of the at least one bus bar to the at least one power semiconductor is obtained through soldering, in particular via the reflow soldering process. In an alternative embodiment of the method, the connection of the at least one contact section of the at least one bus bar is obtained using an insert element, a screw connection and/or the through-hole technology.

Next, further components are attached to the printed circuit board in a supplementing step 32. These other components may include EMC components, etc., which are inserted in at least one non-contact region of the at least one bus bar between the bus bar and the outer layer. Moreover, control electronics components can be attached to the outer layer in the supplementing step 32. In an alternative embodiment of the method, the control electronics components are attached at the same time as the at least one bus bar and the at least one power semiconductor via the reflow soldering process.

Cooling elements can also be attached in the supplementing step 32. In this case, the cooling elements are placed adjacent to the at least one power semiconductor and the at least one bus bar, such that the at least one power semiconductor and/or the at least one bus bar are thermally connected to the cooling element.

REFERENCE SYMBOLS 1, 1a, 1b printed circuit board
2 outer layer
3 second outer layer
4 inner layers
5 insulating layer
6 multilayer system
7, 7a bus bar
8 bus bar
9 contact section
10 insert element
11 pin of the insert element
12, 12b power semiconductor
13, 13a laser vias
14 first inner layer
15 control electronics components on outer layer 2
16, 16a, 16b power region
17, 17a control and regulating region
18 non-contact section
19 surface norm of outer layer 2
20 intermediate space
21 EMC components
22 cooling element
23 SMDs on second outer layer 3
24 bus bar (DC+)
25 bus bar (AC)
26 bus bar (DC−)
27 partial current
28 total current
29 provision step
30 insertion step
31 placement step
32 supplementing step

The invention claimed is:

1. A printed circuit board (PCB) comprising:
a conductive outer layer,
at least one conductive inner layer,
at least one bus bar for conducting current, and
at least one power semiconductor for at least one of controlling or activating the current,
wherein the at least one bus bar and the at least one power semiconductor are disposed on a side of the outer layer facing away from the at least one conductive inner layer,
wherein each one of the at least one bus bar comprises:
  a plurality of contact sections, in which the at least one bus bar is connected in a conductive manner to the outer layer at a plurality contact locations of the PCB, and
  a plurality of non-contact sections, in each of which the at least one bus bar is spaced apart from the outer layer, wherein the plurality of contact sections and the plurality of non-contact sections are arranged in an alternating pattern such that each of the plurality of non-contact sections is between two of the contact sections,
wherein the PCB further comprises a plurality of vias connecting the outer layer to a conductive inner layer of the at least one conductive inner layer directly adjacent to the outer layer directly at each of the plurality of contact locations of the PCB, and
wherein at least one control electronics component is disposed on the outer layer of the PCB in a region of the side of the outer layer facing away from the at least one conductive inner layer, in which neither the at least one bus bar nor the at least one power semiconductor are located.

2. The printed circuit board according to claim 1, wherein the at least one bus bar and the at least one power semiconductor actively cooled by a cooling element.

3. The printed circuit board according to claim 2, wherein the cooling element is suitable for active cooling of the at least one bus bar and the at least one power semiconductor.

4. The printed circuit board of claim 1, wherein at least one of the at least one conductive inner layer has a thickness less than 105 μm.

5. The printed circuit board of claim 1, wherein the at least one bus bar is made of copper or aluminum.

6. The printed circuit board of claim 1, wherein the plurality of contact sections are soldered to the outer layer.

7. The printed circuit board of claim 1, wherein the plurality of contact sections are connected to the outer layer by at least one insert element.

8. The printed circuit board of claim 1, wherein at least one EMC component is located between each of the plurality of non-contact sections of the at least one bus bar and the outer layer.

9. The printed circuit board of claim 1, wherein the at least one bus bar comprises numerous bus bars and wherein the at least one power semiconductor comprises numerous power semiconductors.

10. The printed circuit board of claim 9, wherein at least two of the numerous bus bars are connected by at least two of the numerous power semiconductors connected in parallel.

11. The printed circuit board of claim 1, wherein the at least one bus bar comprises a first bus bar, a second bus bar, and a third bus bar;

wherein the at least one power semiconductor comprises a first plurality of power semiconductors and a second plurality of power semiconductors, wherein the first plurality of power semiconductors are electrically coupled in parallel between the first bus bar and the second bus bar and disposed on the outer layer at a location between the first bus bar and the second bus bar; and wherein the second plurality of power semiconductors are electrically coupled in parallel between the second bus bar and the third bus bar and disposed on the outer layer at a location between the second bus bar and the third bus bar.

* * * * *